US012762358B2

(12) United States Patent
Pourzadi et al.

(10) Patent No.: US 12,762,358 B2
(45) Date of Patent: Oct. 13, 2026

(54) CURRENT-SOURCING TEMPERATURE COMPENSATED LOGARITHMIC TRANSIMPEDANCE AMPLIFIER USING NPN MATCHED TRANSISTORS WITH OUTPUT ADJUSTABLE VOLTAGE

(71) Applicant: CIENA CORPORATION, Hanover, MD (US)

(72) Inventors: Aref Pourzadi, Ottawa (CA); Jorge Aguirre, Kanata (CA); Zhan Xu, Ottawa (CA)

(73) Assignee: CIENA CORPORATION, Hanover, MD (US)

( * ) Notice: Subject to any disclaimer, the term of this patent is extended or adjusted under 35 U.S.C. 154(b) by 36 days.

(21) Appl. No.: 18/985,821

(22) Filed: Dec. 18, 2024

(65) Prior Publication Data

US 2026/0170274 A1 Jun. 18, 2026

(51) Int. Cl.

| | |
|---|---|
| ***G06G 7/24*** | (2006.01) |
| ***H03F 1/08*** | (2006.01) |
| ***H03F 3/08*** | (2006.01) |
| ***H03F 3/45*** | (2006.01) |
| ***H03G 7/06*** | (2006.01) |
| ***H03M 1/08*** | (2006.01) |

(52) U.S. Cl.

CPC ............... *G06G 7/24* (2013.01); *H03F 1/083* (2013.01); *H03F 3/087* (2013.01); *H03F 3/45085* (2013.01); *H03F 3/45475* (2013.01); *H03G 7/06* (2013.01); *H03M 1/089* (2013.01); *H03F 2200/481* (2013.01)

(58) Field of Classification Search

CPC ........... G06G 7/24; H03F 1/083; H03F 3/087; H03F 3/45085; H03F 3/45475; H03F 2200/481; H03G 7/06; H03M 1/089

USPC .......................................................... 327/350

See application file for complete search history.

(56) References Cited

U.S. PATENT DOCUMENTS

| | | | |
|---|---|---|---|
| 4,944,002 | A | 7/1990 | Bader |
| 5,471,173 | A | 11/1995 | Moore et al. |
| 5,481,180 | A | 1/1996 | Ryat |

(Continued)

FOREIGN PATENT DOCUMENTS

| | | |
|---|---|---|
| CN | 116915198 A | 10/2023 |
| WO | 2011137358 A1 | 11/2011 |

OTHER PUBLICATIONS

"AN-311 Theory and Applications of Logarithmic Amplifiers", Texas Instruments, Application Report SNOA575B, Apr. 1991, Revised Apr. 2013, 10 pages.

(Continued)

*Primary Examiner* — Ryan Jager

(74) *Attorney, Agent, or Firm* — Guntin & Gust, PLC; Erik Boyd

(57) ABSTRACT

Aspects of the subject disclosure may include, for example, first and second operational amplifiers; and a differential pair of NPN transistors in a feedback path of the TLA configured to convert an input current signal into an output voltage signal, where a first emitter of a first NPN transistor of the pair of NPN transistors is connected to an inverting input of the first operational amplifier, and where a second emitter of a second NPN transistor of the pair of NPN transistors is connected to a non-inverting input of the second operational amplifier. Other embodiments are disclosed.

20 Claims, 4 Drawing Sheets

100

(56) References Cited

U.S. PATENT DOCUMENTS

| | | | | |
|---|---|---|---|---|
| 6,778,021 | B2 * | 8/2004 | Denoyer | H03F 3/45941 330/110 |
| 7,395,308 | B1 | 7/2008 | Gilbert | |
| 7,952,421 | B2 | 5/2011 | Tripodi et al. | |
| 7,969,223 | B1 * | 6/2011 | Gilbert | G06G 7/24 327/346 |
| 10,956,687 | B1 * | 3/2021 | Ivanov | H03G 7/06 |
| 2003/0052726 | A1 | 3/2003 | Shkap | |
| 2008/0054163 | A1 * | 3/2008 | Suzunaga | G01J 1/44 250/214 A |
| 2014/0306760 | A1 * | 10/2014 | Piepenstock | H03F 3/45475 330/261 |
| 2025/0150079 | A1 * | 5/2025 | Lee | H03K 3/017 |

OTHER PUBLICATIONS

"Integrated DC Logarithmic Amplifiers", Analog Devices, Dep 23, 2005, 15 pages.

* cited by examiner

100

199

CURRENT-SOURCING TEMPERATURE COMPENSATED LOGARITHMIC TRANSIMPEDANCE AMPLIFIER USING NPN MATCHED TRANSISTORS WITH OUTPUT ADJUSTABLE VOLTAGE

FIELD OF THE DISCLOSURE

The subject disclosure relates to a current-sourcing temperature compensated logarithmic transimpedance amplifier using NPN matched transistors with output adjustable voltage.

BACKGROUND

Amplifiers are widely used in various applications, including communication systems, where they convert a wide range of input currents into output voltages. These amplifiers provide accurate power representation of incoming signals, which is important for the performance and reliability of communication systems.

Existing solutions often utilize PNP transistors, which can result in larger layout sizes and increased space requirements. Additionally, traditional amplifiers can suffer from performance variations with temperature changes. This can complicate the calibration process and affect the accuracy of power reporting. Furthermore, the absence of adjustable output voltage features in some designs can limit the dynamic range utilization of subsequent converters.

BRIEF DESCRIPTION OF THE DRAWINGS

Reference will now be made to the accompanying drawings, which are not necessarily drawn to scale, and wherein.

DETAILED DESCRIPTION

Figure 1A:
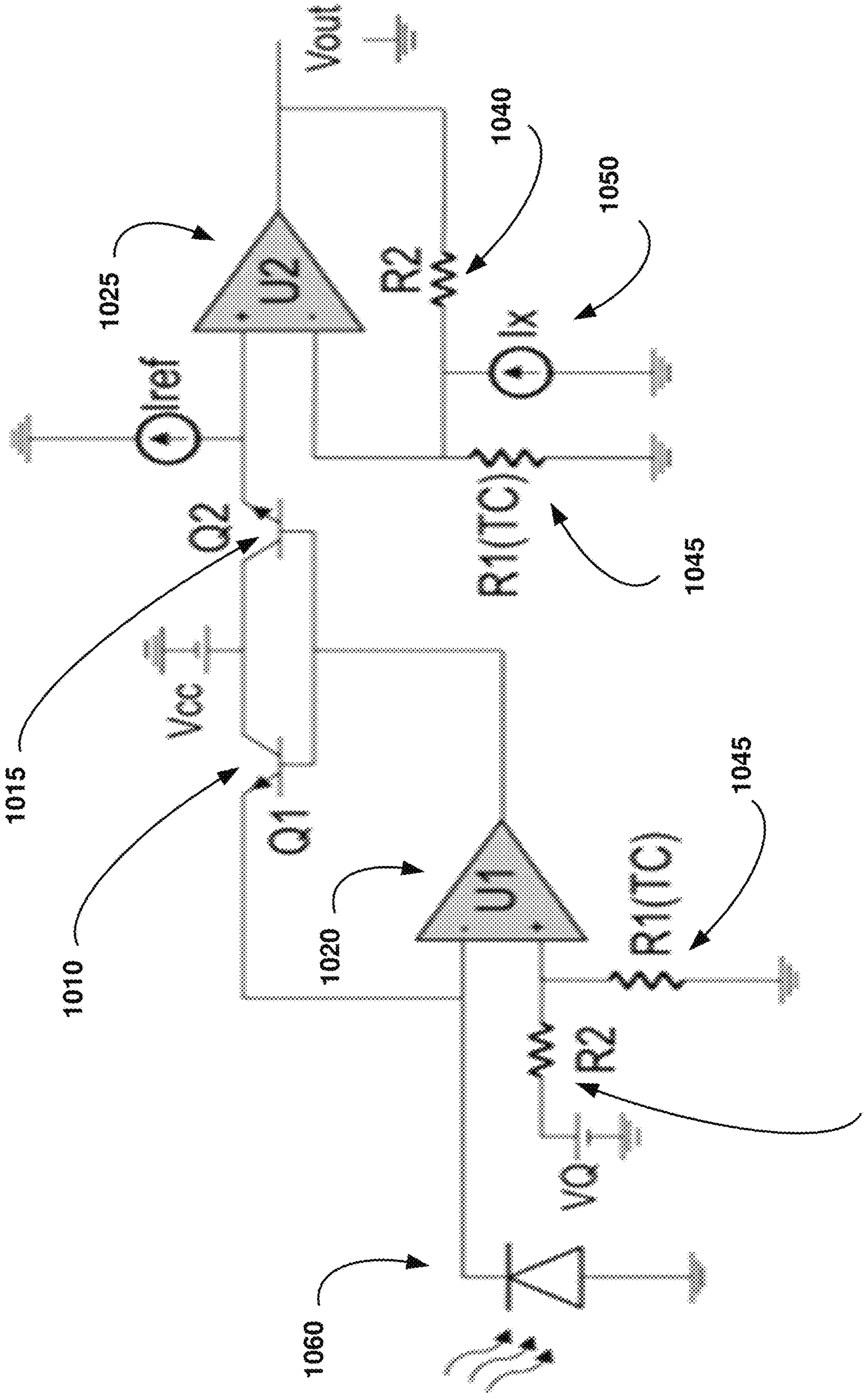
FIG. 1A is a block diagram illustrating an exemplary, non-limiting embodiment of circuit in accordance with various aspects described herein.

The subject disclosure describes, among other things, illustrative embodiments for a space-optimized implementation of current-sourcing temperature compensated log-amp with use of a NPN (Negative-Positive-Negative) transistor differential pair. In one or more embodiments, an adjustable output voltage level can be provided to maximize, increase or otherwise adjust the dynamic range at an input of a subsequent component, such as an Analog-to-Digital Converter (ADC). In one or more embodiments, a configuration can be provided to create a current-sourcing transimpedance logarithmic amplifier with the NPN transistor differential pair in the feedback path. This configuration reduces transistor multiplicity, handling the same or similar current and offering a more compact layout size as compared to contemporary log-amps.

In one or more embodiments, an integrated temperature compensated logarithmic amplifier for optical power reporting is provided according to the configurations described herein which can be integrated with or inside of a coherent pluggable module, such as an OSFP or QSFP-DD. In one or more embodiments, the optimal or improved use of an ADC's full-scale range is provided or otherwise enabled, such as via an integrated offset adjust.

In one or more embodiments, a unique configuration of a current-sourcing temperature compensated logarithmic transimpedance amplifier is provided using NPN matched transistors. This configuration offers several beneficial features including a current-sourcing design. Unlike traditional designs that use PNP transistors, the systems and methodologies described herein utilize NPN transistors in a differential pair which can be beneficial because NPN transistors have a smaller layout size compared to PNP transistors for a same or similar current handling capability. This results in a more compact and space-efficient design, which can be important or crucial for integration in space-constrained environments, such as RF BiCMOS dies used in pluggable coherent modems.

The systems and methodologies described herein provide for temperature compensation by incorporating or otherwise utilizing one or more temperature-sensitive resistors R (TC) to compensate for any temperature dependency of a thermal voltage $V_T$. This can ensure that the logarithmic conversion remains stable and accurate over a wide temperature range, which can be important or essential for applications requiring precise optical power reporting.

The systems and methodologies described herein provide for an adjustable output voltage. In one or more embodiments, a current source $I_x$ (e.g., a DAC controlled current source) that allows for the optimization or improvement of the output voltage level. This feature maximizes, increases or otherwise adjusts the dynamic range at an input of a subsequent component, such as an ADC, ensuring optimal or improved use of the ADC's full-scale range. Other subsequent components can also be utilized with the transimpedance log-amp, including a comparator as part of a Loss Of Signal (LOS) detection circuit.

The systems and methodologies described herein can be utilized with various components or devices, including integration into coherent optical modems. For example, the log-amp configuration described herein can be utilized in coherent pluggable modules, such as OSFP or QSFP-DD. It provides a compact and efficient solution for optical power reporting, which can be important or critical for the performance and reliability of coherent optical communication systems. Overall, the combination of these features including the current-sourcing configuration with NPN transistors, temperature compensation, adjustable output voltage, and suitability for integration in coherent optical modems or other devices, can provide various benefits including efficiency and cost. Other devices other than a coherent modem can be used with the components and functionality described herein, including IMDD (Intensity Modulation Direct Detection) transceivers (e.g., transceivers which transmit an intensity based on PAM4 signaling. Other embodiments are described in the subject disclosure.

In one or more embodiments, each current-sourcing transimpedance logarithmic amplifier utilizes only two NPN transistors (e.g., instead of three or more) as a differential pair with only two operational amplifiers (e.g., instead of three or more). As an example, this configuration can convert an input current signal into an output voltage signal, where a first emitter of a first NPN transistor of the pair of NPN transistors is connected to an inverting input of the first operational amplifier, and where a second emitter of a second NPN transistor of the pair of NPN transistors is connected to a non-inverting input of the second operational amplifier. This configuration can further provide for temperature compensation through the use of one or more temperature-sensitive resistors, which can compensate for temperature changes during operation.

One or more aspects of the subject disclosure include a device operating as a current-sourcing Transimpedance Logarithmic Amplifier (TLA). The device can include operational amplifiers. The device can include a differential pair of NPN transistors in a feedback path of the TLA configured to convert an input current signal into an output voltage signal, where each of the pair of NPN transistors have emitters connected to one of the operational amplifiers. The device can have a temperature-sensitive resistor configured to compensate for a temperature dependency of a thermal voltage associated with the TLA. The device can have an ADC configured to receive the output voltage signal from the TLA. The device can include a current source configured to adjust the output voltage signal to the ADC.

One or more aspects of the subject disclosure include a circuit operating as a current-sourcing TLA. The circuit can include first and second operational amplifiers. The circuit can include a differential pair of NPN transistors in a feedback path of the TLA configured to convert an input current signal into an output voltage signal, where a first emitter of a first NPN transistor of the pair of NPN transistors is connected to an inverting input of the first operational amplifier, and where a second emitter of a second NPN transistor of the pair of NPN transistors is connected to a non-inverting input of the second operational amplifier.

One or more aspects of the subject disclosure include a method for amplifying an input current signal. The method can include utilizing a current-sourcing transimpedance logarithmic amplifier with a differential pair of NPN transistors in a feedback path to convert an input current signal into an output voltage signal. The method can include compensating, utilizing a temperature-sensitive resistor, for temperature dependency of a thermal voltage. The method can include adjusting the output voltage signal using a DAC-controlled current source to adjust a dynamic range at an input of an ADC.

FIG. 1A is a block diagram illustrating an exemplary, non-limiting embodiment of a current-sourcing temperature compensated log-amp 100, such as for use with self-biased grounded anode photodiode applications or other circuits that make use of current sourcing transimpedance log-amp functionality.

The logarithmic transimpedance amplifier circuit 100 can convert a wide range of input currents into output voltages, where the voltage is a logarithmic function of the input current. As an example, inside of a modem, the log-amp 100 can be located between a photodiode and an ADC. It functions as a logarithmic current into linear voltage converter interface and gives a power representation of an incoming optical signal. In one embodiment, the slope of this transformation (e.g., due to temperature compensation configurations including the use of temperature sensitive resistors) does not vary over temperature (or varies within a threshold range that is determined to be acceptable) which avoids the need for a complex modem calibration.

A temperature compensated log-amp circuit can be described by the following equation:

$$Vout = \left\{\left(1 + \frac{R_2}{R_1(TC)}\right)V_T \ \ln\frac{I_{in}}{I_{ref}}\right\} \qquad \text{Eq (1)}$$

The thermal voltage ($V_T$) is a temperature dependent parameter. This dependency can be compensated for by using one or more temperature sensitive resistors ($R_1$(TC)).

Depending on the type of differential pair chosen, NPN or PNP, a transimpedance logarithmic amplifier can be a current-sinking or current-sourcing input circuit.

Eq (2) describes the working mechanism of log-amp 100 which operates as a current-sourcing circuit:

$$Vout = \left\{\left(1 + \frac{R_2}{R_1(TC)}\right)V_T \ \ln\frac{I_{in}}{I_{ref}}\right\} + V_Q - RI_x \qquad \text{Eq (2)}$$

The circuit 100 can be implemented using two operational amplifiers 1020, 1025, along with a differential pair of NPN transistors 1010, 1015.

In one embodiment, the input current is sourced into the differential pair of NPN transistors 1010, 1015, and the output is taken from the subtraction of base-emitter voltages, $V_{BEQ1}-V_{BEQ2}$, which follows the logarithmic function of the input current. To maintain consistent performance over temperature, a temperature-sensitive resistor 1045 ($R_1$(TC)) is used to cancel out or otherwise mitigate the thermal voltage ($V_T$) temperature sensitivity. The reference current Iref provides a baseline for logarithmic conversion and allows $V_{out}$ to be referenced to a known current. $V_Q$ is the bias voltage of operational amplifier 1020 ($U_1$). The $I_x$ is a DAC-controlled current source to optimize the output level voltage of the log-amp 100, ensuring that the full-scale of a subsequent ADC input is utilized.

Circuit 100 provides a current-sourcing log-amp which utilizes an NPN differential pair instead of PNP differential pair. In many semiconductor technologies, such as high-performance RF BICMOS STMicroelectronics B55, GLOBALFOUNDRIES 8XP and 9HP, TOWERJAZZ SBC18H6, the PNP transistor layout size is larger than an NPN transistor layout size when handling a same or similar current. Layout or implementation size is crucial or important when integrating a logarithmic amplifier inside of a RF BiCMOS die, due to space constraints in the modem implementation, crucially in pluggable coherent modems such as for 800ZR and 1600LR/ZR in an OSFP or QSFP-DD format.

The use of NPN transistors in the circuit 100, can lead to a reduction in the required transistor multiplicity (approximately 30% to 40% layout space saving depending on the current handling), which in turn contributes to a more compact chip layout.

In one or more embodiments, the temperature compensated logarithmic amplifier (log-amp) 100 is used instead of a standard log-amp to ensure that the logarithmic conversion remains stable and accurate over a wide temperature range. This can be achieved by utilizing various resistors including temperature-sensitive resistors such as resistors 1045 to compensate for the temperature dependency of the thermal voltage $V_T$. The thermal voltage $V_T$ is a temperature-dependent parameter, and without compensation, the performance of the log-amp could vary significantly with temperature changes. This stability is crucial for applications requiring precise optical power reporting, such as in coherent optical communication systems. By maintaining consistent performance over temperature, the temperature compensated log-amp 100 ensures reliable and accurate measurements, which is essential for the integration in space-constrained environments like RF BiCMOS dies used in pluggable coherent modems. Various temperature compensation functionality and components can be utilized in conjunction with or in place of temperature-sensitive resistors, such as a compensation signal being generated using a voltage difference between two bipolar junction transistor (BJT) emitter bases, each of which individually loads a proportional-to-absolute temperature (PTAT) current and a zero-to-absolute temperature (ZTAT) current.

FIG. 1A illustrates the current-sourcing temperature compensated logarithmic transimpedance amplifier 100 which converts a wide range of input currents into output voltages, providing accurate power representations of incoming signals. The components of the amplifier 100 include NPN Transistor 1010 which forms part of the differential pair in the feedback path of the amplifier. The emitter of the NPN transistor 1010 is connected to the inverting input of the operational amplifier 1020 and works with NPN transistor 1015 to convert the input current signal into an output voltage signal. NPN transistor 1015 is the other part of the differential pair. It has an emitter connected to the non-inverting input of the operational amplifier 1025 and works with NPN Transistor 1010 to convert the input current signal into an output voltage signal. It is also connected to a reference current source (Iref), which provides a reference current for logarithmic conversion.

In operation, the operational amplifier 1020 receives the input current signal at the inverting input from the photodiode 1060. The second operational amplifier 1025 amplifies the base-emitter voltage difference (VBEQ1−VBEQ2) between the NPN transistor 1010 and the NPN transistor 1015 at its non-inverting input, with a determined scale based on the resistor ratio 1040 (R2) 1045 (R1(TC)). The difference in base-emitter voltages of NPN transistors 1010 and 1015 generates a logarithmic voltage proportional to the ratio of the received current from the photodiode 1060 at the non-inverting input of operational amplifier 1020 and Iref. The resistors 1040 and 1045 determine the amplification of operational amplifier 1025 and contribute to setting the bias condition of the operational amplifier 1020. Temperature-sensitive resistor 1045 (R1(TC)) cancels out the temperature dependency of the NPN transistor thermal voltage ($V_T$), ensuring that the logarithmic conversion remains stable and accurate over a wide temperature range. Operational amplifier 1025 works with the DAC-controlled current source 1050 (Ix) to adjust the output voltage level, maximizing the dynamic range at the input of a subsequent ADC (not shown). In one or more embodiments, the log-amp described in the various embodiments can be utilized in other devices which may or may not include a photodiode. For example, the amplifier 100 can be utilized in radiation detectors where ionization chamber electrodes generate a current proportional to radiation intensity such as an Xray. Another example is a photomultiplier tube that generates a small current in response to light.

Current Source 1050 (Ix) can be a DAC-controlled current source which allows for the optimization of the output voltage level, ensuring that the full-scale range of the ADC is utilized. Photodiode 1060 provides the input current signal to the amplifier 100. The input current signal is converted into an output voltage signal through the logarithmic transimpedance amplifier 100. Other techniques and/or components can be utilized for controlling the current source with or without the DAC, such as a coarse and fine DAC control or being controlled directly from the SPI.

In one embodiment, the amplifier 100 can be configured to be integrated within a coherent pluggable module, such as an OSFP or QSFP-DD, providing a compact and efficient solution for optical power reporting. The output voltage (Vout) is a logarithmic function of the input current signal, providing an accurate power representation of the incoming optical signal.

In one embodiment, one or more variable resistors can be utilized (e.g., in conjunction with or in place of one or more of resistors 1040, 1045) to facilitate operation of the log-amp 100 including facilitating temperature compensation. In one embodiment, a feedback loop can be utilized for measuring changes in order to adjust variable resistors. In other embodiments, instead of variable resistors, switchable resistors can be utilized. In one embodiment, the value of the resistor(s) can be changed by or from the SPI, such as through use of switches.

Figure 1B:
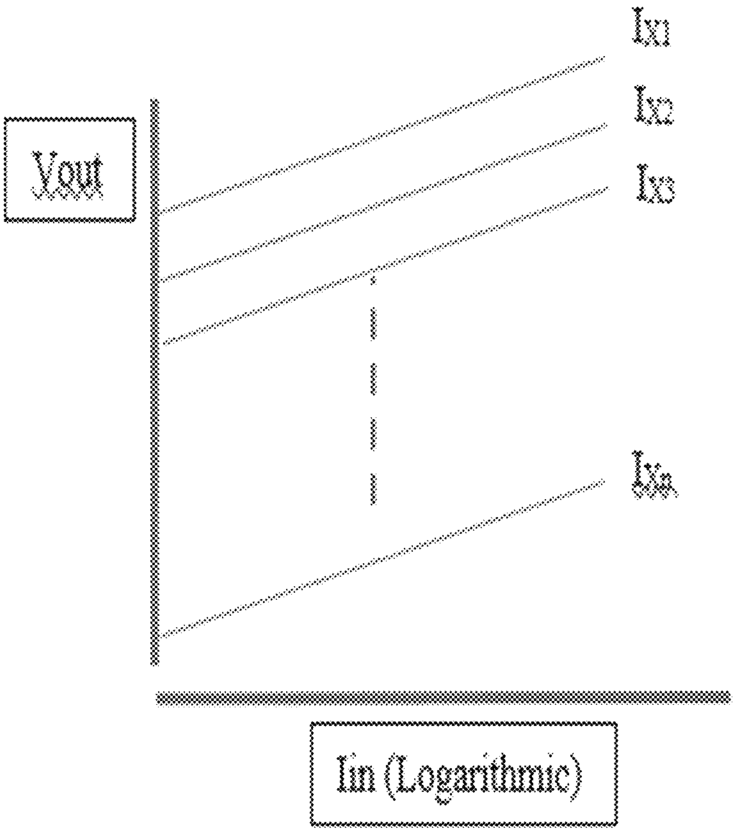
FIG. 1B is a graph of output voltage and input current for an exemplary, non-limiting embodiment of the circuit of FIG. 1A in accordance with various aspects described herein.

FIG. 1B illustrates the relationship between the input current $I_{in}$ (Logarithmic) and the output voltage $V_{out}$ in a current-sourcing temperature compensated logarithmic transimpedance amplifier, such as circuit 100. The graph 199 includes the components $V_{out}$, $I_{x1}$, $I_{x2}$, $I_{x3}$, and $I_{xa}$. $V_{out}$ represents the output voltage of the amplifier 100. The output voltage $V_{out}$ is a logarithmic function of the input current $I_{in}$ (Logarithmic), providing an accurate power representation of the incoming optical signal. The output voltage $V_{out}$ is adjusted by the current sources $I_{x1}$, $I_{x2}$, $I_{x3}$, and $I_{xa}$ to optimize the dynamic range at the input of a subsequent ADC. This is a DAC-controlled current source that allows for the optimization of the output voltage level.

Figure 2:
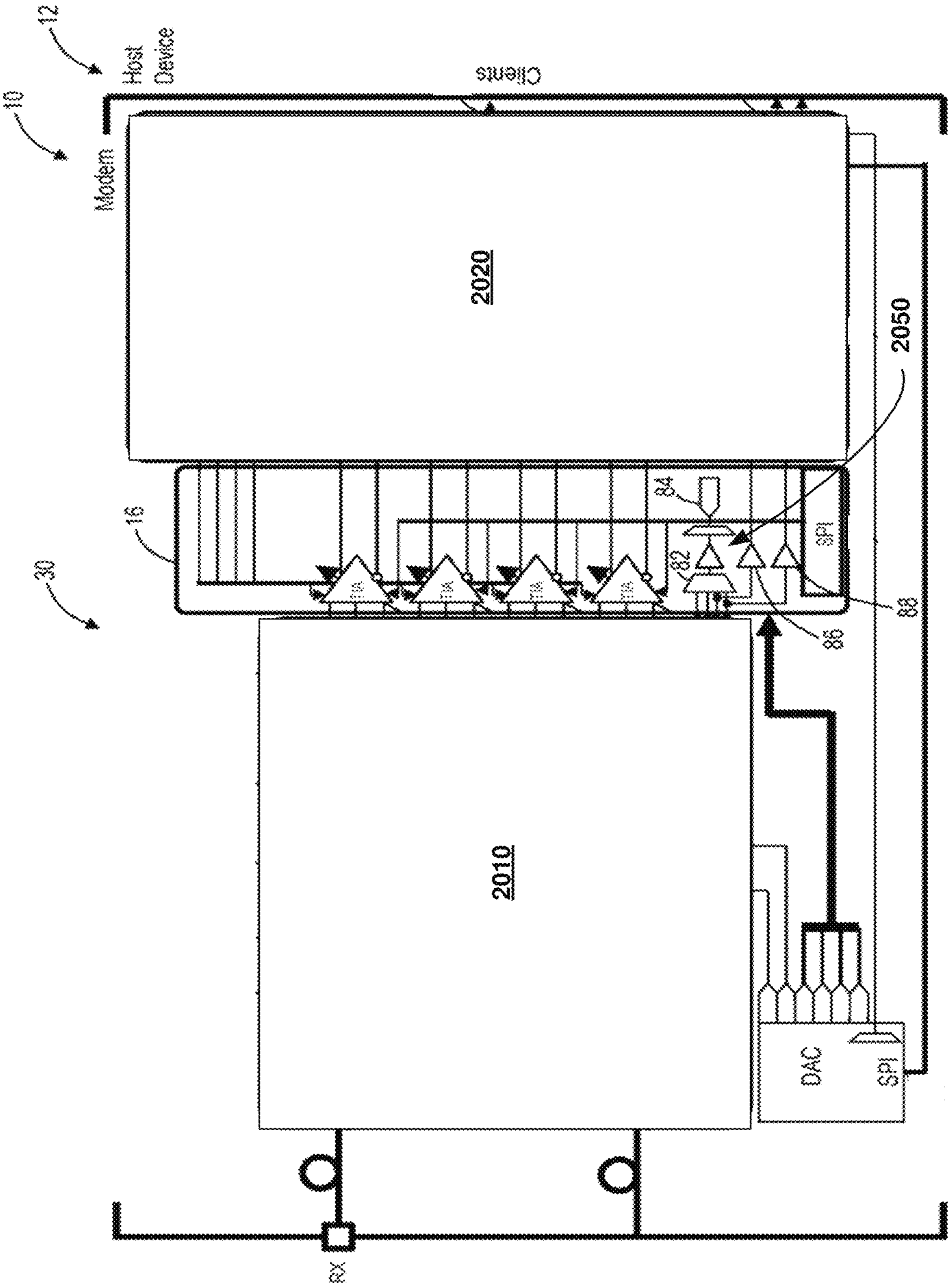
FIG. 2 is a circuit diagram of a receiver in a coherent optical modem in accordance with various aspects described herein.

In one embodiment, the input current signal is between 1 nA and 700 uA. In one embodiment, the output voltage signal is between 0.1V and 1.6V. Other input currents and output voltages can also be selected or utilized based on the particular device or application that is utilizing the transimpedance log-amp. It should be further understood that log amp 100 allows for control or adjustment of the slope illustrated in graph 199 as well as the step (or selected one of the current sources $I_{xa}$). Management, control or adjustment of parameters including one or more of reference current (Iref) and/or current source ($I_x$ which can be a DAC-controlled current source) allows for control over the output voltage signal as described herein FIG. 2 is a circuit diagram 200 of a receiver 30 in a coherent optical modem 10 in accordance with various aspects described herein. The example embodiment is presented for illustration purposes only, as well as only focusing on particular components in the coherent optical modem 10 including a transimpedance logarithmic amplifier 2050. Other coherent optical interfaces, form factors, etc. are contemplated herewith. As an example, the coherent modem 10 can be configured to receive and transmit optical signals from an adjacent coherent modem (not shown) to form a bi-directional communication link. The coherent modem 10 can operate in a host device 12, such as a switch, router, computing device, network element, etc. The coherent modem 10 can be a pluggable optical module, an on-board optical module, an optical subassembly, etc. Also, those skilled in the art will appreciate other terms or descriptions may be used to refer to the coherent modem 10, such as a transceiver, transmitter/receiver, optical module, transponder, etc.

Logically, the coherent optical modem 10 can include a coherent receiver 30 and a coherent transmitter. For instance, the coherent receiver 30 can include an Intradyne/Integrated Coherent Receiver (ICR) 2010 (which includes various components such as a Photonic Integrated Circuit (PIC)) and a Transimpedance Amplifier (TIA) 16 (which includes various components such as the transimpedance logarithmic amplifier 2050).

In operation, the ICR 2010 is configured to receive an optical signal and perform demodulation thereof, where the ICR 2010 with the PIC mixes the incoming optical signal with a Local Oscillator (LO) laser within the same optical frequency (or very close to it) in a process known as coherent detection. This mixing can occur in an optical hybrid, which combines the phases of the signal and LO light in such a way that it allows the direct detection of both the phase and amplitude of the optical field. The output from the optical hybrid in the PIC can then be converted into electrical signals by photodiodes connected to the TIA 16, which are processed to recover the transmitted data. The optical modem 10 can include a transmitter to modulate a corresponding optical signal for transmission utilizing various components such as a PIC, driver, etc.

Collectively, the output in the coherent receiver 30 from the TIA 16 connects to processing circuitry 2020, and the input to the coherent transmitter connects to the processing circuitry 2020. The processing circuitry 2020 can include an ASIC or the like that includes a DSP component. In one embodiment, a single chip can be used for both the coherent receiver 30 and the coherent transmitter, or other configurations or form factors can be utilized. In an embodiment, the coherent optical module 10 can be in a pluggable form factor, such as, e.g., QSFP-DD, Octal SFP (OSFP), OSFP eXtra Dense (OSFP-XD), and the like.

An input power reporting circuit of the ICR 2010 can include power taps and Variable Optical Attenuators (VOAs), such as power taps before and after the VOAs. For example, the power taps can be on the X and Y polarizations before and after the VOAs. The power taps can connect to photodetectors. Outputs of the photodetectors can be aggregated together via a current multiplexer (IMUX) 82, for reporting power, via a low-speed ADC 84, with a logarithmic amplifier 2050 (e.g., a Transimpedance Logarithmic Amplifier) positioned between the IMUX 82 and the ADC 84. In one or more embodiments, the logarithmic amplifier 2050 can be or can include (in whole or in part) logarithmic amplifier 100 (or components/portions thereof) that utilizes an NPN transistor configuration as a differential pair.

One or more of the outputs of the photodetectors of ICR 2010 are amplified by amplifiers 86, 88 and go through a comparator, which can have a threshold and hysteresis, and can provide for a hardware LOS interrupt to the processing circuitry 2020, such as to a DSP/LOS firmware for prioritizing LOS detection in the processing circuitry and raising an INTL pin, if appropriate. In one embodiment, the receiver 30 can support a single wavelength, with dual polarizations, X and Y. In this example, the outputs of photodetectors of the ICR 2010 are provided to the amplifiers 86, 88, to provide two LOS interrupt signals, which are an LOS X interrupt and an LOS Y interrupt. In one embodiment, a DSP/LOS can implement prioritized detection of LOS based on either interrupt, as well as focus on the specific polarization, e.g., detect LOS on the X polarization based on the LOS X interrupt.

The difference between the NPN transimpedance log-amp 2050 and a contemporary log amp lies in several key aspects including the transistor type. The NPN transimpedance log-amp 2050 utilizes NPN transistors in the differential pair, whereas contemporary log amps use PNP transistors. NPN transistors have a smaller layout size compared to PNP transistors for the same current handling capability. This results in a more compact and space-efficient design. The NPN transimpedance log-amp 2050 is a current-sourcing device, which is different from the current-sinking design commonly found in contemporary log amps. This current-sourcing configuration of log amp 2050 is particularly beneficial for integration in space-constrained environments, such as RF BiCMOS dies used in pluggable coherent modems. The NPN transimpedance log-amp 2050 incorporates a temperature-sensitive resistor(s) $R_1$(TC) to compensate for the temperature dependency of the thermal voltage $V_T$. This ensures that the logarithmic conversion remains stable and accurate over a wide temperature range. Contemporary log amps, not having temperature compensation, suffer from performance variations with temperature changes. The NPN transimpedance log-amp 2050 includes a DAC-controlled current source $I_x$ that allows for the optimization of the output voltage level. This feature maximizes the dynamic range at the input of a subsequent ADC, ensuring optimal use of the ADC's full-scale range.

Figure 3:
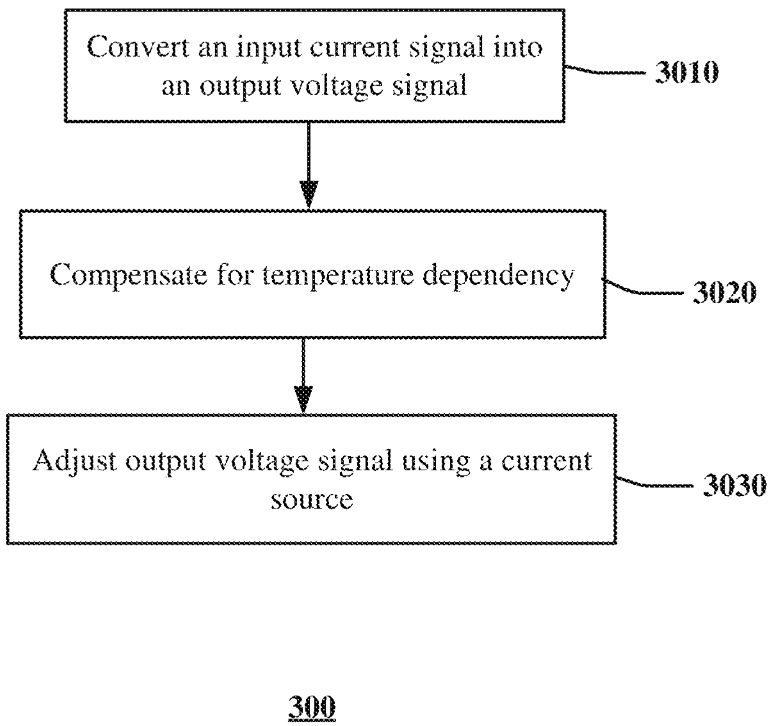
FIG. 3 depicts an illustrative embodiment of a method in accordance with various aspects described herein.

FIG. 3 depicts an illustrative embodiment of a method 300 in accordance with various aspects described herein. Method 300 can be implemented by various circuits, devices and/or systems for amplifying an input current signal using a current-sourcing transimpedance logarithmic amplifier. For example, the method 300 can be implemented by a device or circuit designed to convert input current signals into output voltage signals, compensate for temperature dependency, and adjust the output voltage signal using a current source.

At 3010, the method 300 converts an input current signal into an output voltage signal. This conversion can be performed by a current-sourcing transimpedance logarithmic amplifier that utilizes a differential pair of NPN transistors in the feedback path. The differential pair of NPN transistors ensures that the input current signal is accurately converted into an output voltage signal.

At 3020, the method 300 compensates for temperature dependency. This compensation is achieved by using a temperature-sensitive resistor(s) that adjusts for the temperature dependency of the thermal voltage. The temperature-sensitive resistor(s) ensures that the logarithmic conversion remains stable and accurate over a wide temperature range, maintaining consistent performance.

At 3030, the method 300 adjusts the output voltage signal using a current source. The current source, such as a DAC-controlled component, optimizes the output voltage level to maximize, increase or otherwise adjust the dynamic range at the input of a subsequent ADC. This adjustment ensures that the full-scale range of the ADC is utilized, providing accurate and stable performance over a wide range of input currents.

While for purposes of simplicity of explanation, the respective processes are shown and described as a series of blocks in FIG. 3, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data. Computer-readable storage media can comprise the widest variety of storage media including tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A device operating as a current-sourcing Transimpedance Logarithmic Amplifier (TLA), the device comprising:
- operational amplifiers;
- a differential pair of NPN transistors in a feedback path of the TLA configured to convert an input current signal into an output voltage signal, each of the pair of NPN transistors having emitters connected to one of the operational amplifiers;
- a temperature-sensitive resistor configured to compensate for a temperature dependency of a thermal voltage associated with the TLA;
- an analog-to-digital converter (ADC) configured to receive the output voltage signal from the TLA; and
- a current source configured to adjust the output voltage signal to the ADC.

2. The device of claim 1, wherein the current source comprises a DAC-controlled current source.

3. The device of claim 1, comprising a photodiode configured to provide the input current signal to the TLA.

4. The device of claim 1, wherein the temperature-sensitive resistor comprises first and second temperature-sensitive resistors, wherein the first temperature-sensitive resistor is connected to an inverting input of a first operational amplifier of the operational amplifiers, and wherein the second temperature-sensitive resistor is connected to a non-inverting input of a second operational amplifier of the operational amplifiers.

5. The device of claim 1, wherein a first emitter of a first NPN transistor of the pair of NPN transistors is connected to an inverting input of a first operational amplifier of the operational amplifiers, and wherein a second emitter of a second NPN transistor of the pair of NPN transistors is connected to a non-inverting input of a second operational amplifier of the operational amplifiers.

6. The device of claim 1, wherein the TLA is integrated in an optical pluggable module.

7. The device of claim 1, wherein the input current signal is between 1 nA and 700 uA.

8. The device of claim 1, wherein the output voltage signal is between 0.1V and 1.6V.

9. A circuit operating as a current-sourcing Transimpedance Logarithmic Amplifier (TLA), the circuit comprising:
- first and second operational amplifiers;
- a differential pair of NPN transistors in a feedback path of the TLA configured to convert an input current signal into an output voltage signal, wherein a first emitter of a first NPN transistor of the pair of NPN transistors is connected to an inverting input of the first operational amplifier, and wherein a second emitter of a second NPN transistor of the pair of NPN transistors is connected to a non-inverting input of the second operational amplifier; and
- first and second temperature-sensitive resistors, wherein the first temperature-sensitive resistor is connected to a non-inverting input of the first operational amplifier, and wherein the second temperature-sensitive resistor is connected to an inverting input of the second operational amplifier.

10. The circuit of claim 9, comprising a temperature-sensitive resistor configured to compensate for a temperature dependency of a thermal voltage associated with the TLA.

11. The circuit of claim 9, comprising an analog-to-digital converter (ADC) configured to receive the output voltage signal from the TLA.

12. The circuit of claim 9, comprising a current source configured to adjust the output voltage signal to an ADC.

13. The circuit of claim 12, wherein the current source comprises a DAC-controlled current source.

14. The circuit of claim 9, comprising a photodiode configured to provide the input current signal to the TLA.

15. The circuit of claim 9, wherein the input current signal is between 1 nA and 700 uA.

16. The circuit of claim 9, wherein the output voltage signal is between 0.1V and 1.6V.

17. A method for amplifying an input current signal, comprising:

utilizing a current-sourcing transimpedance logarithmic amplifier with a differential pair of NPN transistors in a feedback path to convert an input current signal into an output voltage signal;

compensating, utilizing a temperature-sensitive resistor, for temperature dependency of a thermal voltage; and adjusting the output voltage signal using a DAC-controlled current source to adjust a dynamic range at an input of an analog-to-digital converter (ADC).

18. The method of claim 17, wherein the input current signal is between 1 nA and 700 uA.

19. The method of claim 17, wherein the output voltage signal is between 0.1V and 1.6V.

20. The method of claim 17, wherein the input current signal is generated by a photodiode.

* * * * *